United States Patent [19]

Fu et al.

[11] Patent Number: 5,539,312
[45] Date of Patent: Jul. 23, 1996

[54] DETECTION AND MEASUREMENT OF MOTION DURING NMR IMAGING USING ORBITAL NAVIGATOR ECHO SIGNALS

[75] Inventors: Zhuo F. Fu, New York, N.Y.; Richard L. Ehman, Rochester, Minn.

[73] Assignee: Mayo Foundation for Medical Education and Research, Rochester, Minn.

[21] Appl. No.: 382,711

[22] Filed: Feb. 2, 1995

[51] Int. Cl.$^6$ .................................................. G01R 33/48
[52] U.S. Cl. ........................................ 324/309; 128/653.2
[58] Field of Search ..................................... 324/309, 307, 324/300, 314, 312; 128/653.2, 653.5

[56] References Cited

U.S. PATENT DOCUMENTS

| | | | |
|---|---|---|---|
| 4,307,343 | 12/1981 | Likes | 324/309 |
| 4,797,616 | 1/1989 | Matsui et al. | 324/309 |
| 4,937,526 | 6/1990 | Ehman et al. | 324/309 |
| 5,185,574 | 2/1993 | Ehman et al. | 324/309 |
| 5,323,110 | 6/1994 | Fielden et al. | 324/309 |
| 5,363,844 | 11/1994 | Riederer et al. | 128/653.2 |
| 5,382,902 | 1/1995 | Tanigachi et al. | 324/309 |
| 5,427,101 | 6/1995 | Sachs et al. | 324/309 |

OTHER PUBLICATIONS

*Detection and Measurement of Multiaxis Object Displacement and Rotation During Imaging, with a Single "Orbital" Navigator Echo*, Mar., 1994 SMR Meeting, Z. Fu et al.

*Optimization of Orbital Navigator Echo Technique in Motion Measurement of MR Imaging*, Aug. 1994 SMR Meeting, Z. Fu et al.

*Orbital Navigator Echoes for Motion Measurements in Magnetic Resonance Imaging*, Z. Fu et al. *Adaptive Corrections for Rotational Motion in MR Imaging*, H. W. Korin et al.

*Primary Examiner*—Sandra L. O'Shea
*Assistant Examiner*—Raymond Y. Mah
*Attorney, Agent, or Firm*—Quarles & Brady

[57] ABSTRACT

An NMR image data set is acquired along with interleaved navigator signals. The navigator signals are acquired while two, orthogonal readout gradients are applied such that a circular orbit in k-space is sampled. The navigator signals are analyzed to detect object motion and to produce corrective values for the NMR image data to reduce artifacts caused by object rotation and displacement along two axes.

7 Claims, 3 Drawing Sheets

DETECTION AND MEASUREMENT OF MOTION DURING NMR IMAGING USING ORBITAL NAVIGATOR ECHO SIGNALS

BACKGROUND OF THE INVENTION

The field of the invention is nuclear magnetic resonance imaging methods and systems. More particularly, the invention relates to the reduction of motion artifacts in NMR images using correction methods described in U.S. Pat. No. 4,937,526.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_x$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Object motion during the acquisition of NMR image data produces both blurring and "ghosts" in the phase-encoded direction. Ghosts are particularly apparent when the motion is periodic, or nearly so. For most physiological motion each view is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition.

Another proposed method for eliminating ghost artifacts is disclosed in U.S. Pat. No. 4,567,893, issued on Feb. 4, 1986. This prior patent teaches that the distance in the image between the ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic.

Yet another method for reducing the undesirable effects due to periodic signal variations is disclosed in U.S. Pat. No. 4,706,026 issued on Nov. 10, 1987 and entitled "A Method For Reducing Image Artifacts Due To Periodic Variations In NMR Imaging." In one embodiment of this method, an assumption is made about the signal variation period (e.g. due, for example, to patient respiration) and the view order is altered from the usual monotonically increasing phase-encoding gradient to a preselected order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the patient motion, and particularly, any variations in the periodicity of that motion.

Yet another method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling".

U.S. Pat. No. 4,937,526 describes a method for reducing motion artifacts in NMR images in which the NMR data set used to reconstruct the image is corrected after its acquisition using information acquired concurrently in NMR "navigator" signals. The navigator signals are produced by pulse sequences which are interleaved with the imaging pulse sequences and which are characterized by the absence of phase encoding. The navigator signal is thus a projection along an axis defined by the readout gradient which is fixed in direction throughout the scan. As a result, the navigator signals detect spin motion only along the direction of this readout gradient. A second navigator pulse sequence with an orthogonal readout gradient can also be interleaved throughout the scan, but this further lengthens the scan time and is seldom done. In addition, even when two "orthogonal" navigator signals are acquired during the scan, they do not provide the information required to correct for in-plane rotation of the subject. Such rotational motion is particularly troublesome when imaging certain subjects such as the human heart, or when performing brain function MRI.

SUMMARY OF THE INVENTION

The present invention is a method for detecting motion along two in-plane axes and for detecting rotational motion of the subject. More specifically, the invention includes acquiring a series of NMR signals using an imaging pulse sequence to acquire an image NMR data set; interleaving with the series of imaging pulse sequences a series of pulse sequences to acquire a corresponding series of navigator NMR signals, each navigator pulse sequence including the application of two, in-plane, orthogonal magnetic field gradients during the readout of its navigator NMR signal such that the navigator NMR signal samples a substantially circular, or "orbital" path in k-space.

A general object of the invention is to provide information with which an acquired image NMR data set can be corrected for in-plane view-to-view subject motion. By measuring shifts in the orbital navigator NMR signals with respect to a reference orbital navigator signal, corrective values can be calculated for each corresponding NMR imaging signal. These corrections offset artifact producing errors caused by in-plane translational motion of spins in any direction, as well as errors caused by in-plane rotational motion of spins.

Another object of the invention is to acquire information from which corrections can be made to an image NMR data set without further lengthening the scan time. A single orbital navigator pulse sequence is sufficient to acquire corrective information for all in-plane spin motion. It requires the same scan time as prior "single axis" navigator pulse sequences.

Yet another object of the invention is to detect in-plane motion of the subject being imaged during an NMR scan. By interleaving navigator pulse sequences into the NMR scan, in-plane subject motion can be monitored throughout the acquisition. The detected movement may be used to correct the acquired NMR image data, or it may be used in other ways. For example, detected motion may be employed as a means for gating the acquisition of NMR image data, or it may be used as a signal to discard and reacquire NMR image data, or it may be used to simply stop the NMR scan when the detected motion is unacceptable for the procedure being performed.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 1:
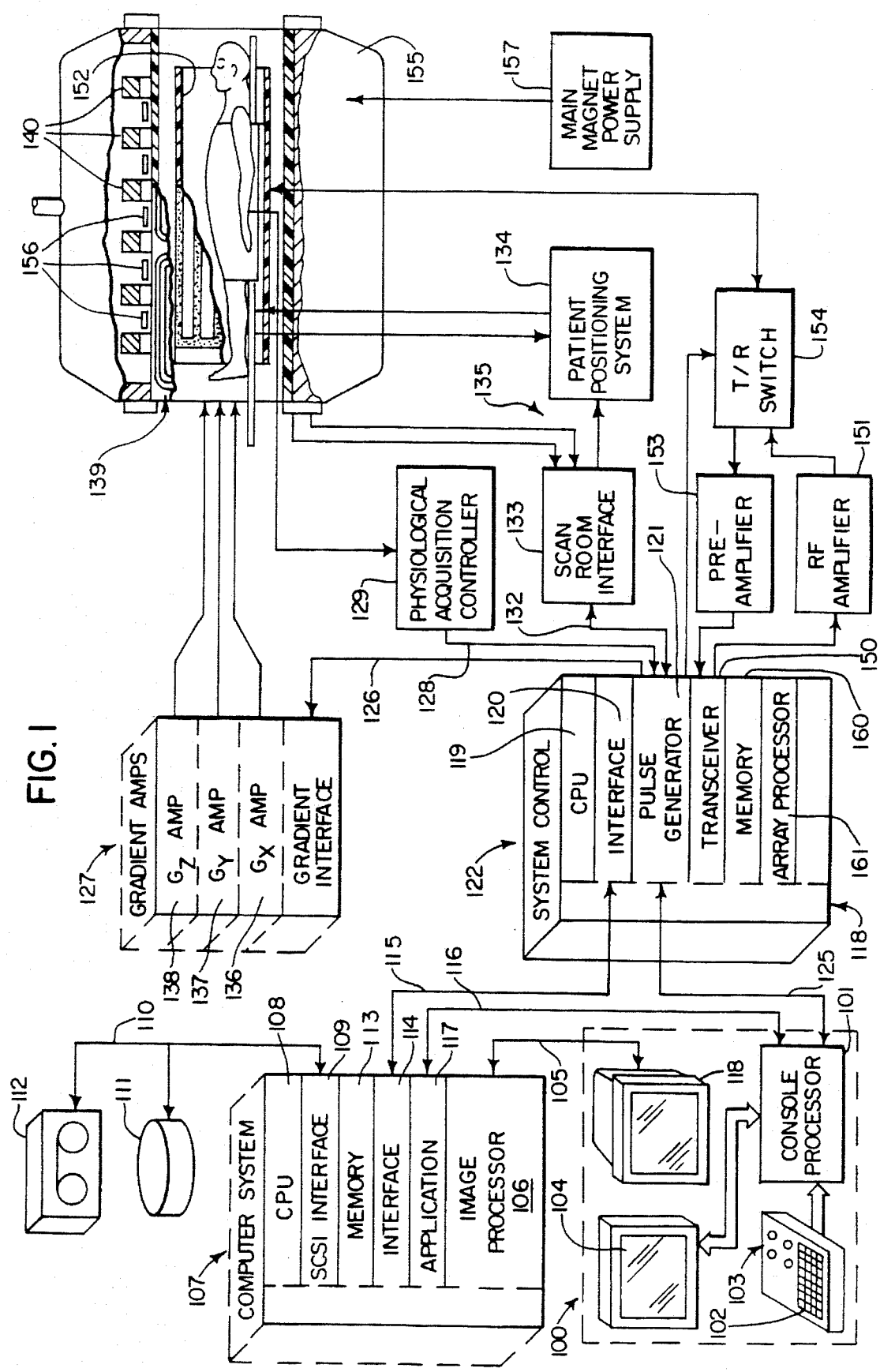
FIG. 1 is a block diagram of an NMR system which employs the present invention.

It is well known that the NMR signal measured during acquisition in a slice disposed in the x-y plane can be defined as follows:

$$S(k_x, k_y) = \int_\Omega m(x,y)e^{i(k_x x + k_y y)}dxdy \tag{1}$$

where $\Omega$ is the area of the integral. If the NMR signal is produced by sampling a circular path in k-space using the orbital navigator pulse sequence of the present invention, the signal may be expressed as follows in polar coordinates:

$$S(k_p, \theta) = \int_\Omega m(x,y)e^{ik_p(x\cos\theta + y\sin\theta)}dxdy \tag{2}$$

where $k_p$ is the radius of the circular path in k space and $\theta$ is the azimuth angle measured from the starting point on the circular path.

If the imaged object is rotated by an angle $\alpha$ and two-dimensionally displaced from (x,y) by amounts $x_0$ and $y_0$, its new position (x',y') is a follows:

$x'=x\cos\alpha + y\sin\alpha - x_0$ $y'=-x\sin\alpha + y\cos\alpha - y_0$.

It can be proven that in the polar coordinates of k-space, for global motion[1] the altered NMR navigator signal S' would be:

$$S'(k_p,\theta)=S(k_p,\zeta-\alpha)e^{ik_p(y_0\sin\theta + x_0\cos\theta)} \tag{3}$$

This equation indicates that the rotation ($\alpha$) of the object can be measured as a shift of the modulus of the raw (untransformed) NMR navigator signal with respect to the unperturbed (reference) NMR navigator signal. It is also clear that the modulus of the orbital NMR navigator signal only depends on rotation, thus, detection of rotational motion is insensitive to any concurrent translations.

Furthermore, after the rotation angle ($\alpha$) is known, the displacements ($x_0, y_0$) of the object can be measured by comparing the phase difference between the perturbed orbital NMR navigator signal and the reference navigator signal. Since the phase difference is the sum of sine and cosine terms which are linearly independent of each other, the displacements ($x_0, y_0$) can be derived from the following formula:

$$x_0 = \frac{1}{\pi k_\rho} \int_0^{2\pi} \Delta\psi\cos\theta d\theta \text{ and } y_0 = \frac{1}{\pi k_\rho} \int_0^{2\pi} \Delta\psi\sin\theta d\theta \quad (4)$$

where $\Delta\psi$ is the phase difference between corresponding points in a reference navigator signal and the orbital navigator signal, after the rotation effect ($\alpha$) has been taken into account.

The view-to-view in-plane motion of an object, both rotational and translational, can therefore be determined by analyzing the raw, k-space, orbital NMR navigational signal. The reference navigator signal is compared with the orbital NMR navigation signal, and the amount of shift in their modulus values is measured by a "least-squares-residual" method described in Z. W. Fu, D. J. Burkart, J. P. Felmlee, R. C. Grimm, R. L. Ehman. "Clinical trial of adaptive correction of motion in shoulder MR imaging", JMRI 4(P) 61 (1994). This is a measure of the angle of rotation ($\alpha$). The displacements $x_0$ and $y_0$ can then be calculated according to equation (4) above. As explained in U.S. Pat. No. 4,937,526, these values ($\alpha$, $x_0$, $y_0$) may then be used to correct the NMR image data set.

DESCRIPTION OF THE PREFERRED EMBODIMENT

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 includes a number of modules which communicate with each other through a backplane. In addition to the application interface 117 and the image processor 106, these include a CPU module 108 that controls the backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x=\partial B_z/\partial x$, $G_y=\partial B_z/\partial y$ and $G_z=\partial B_z/\partial z$, and the magnetic field at any point (x,y,z) in the bore of the magnet assembly 141 is given by $B(x,y,z)=B_0+G_xX+G_yY+G_zZ$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118.

Figure 2:
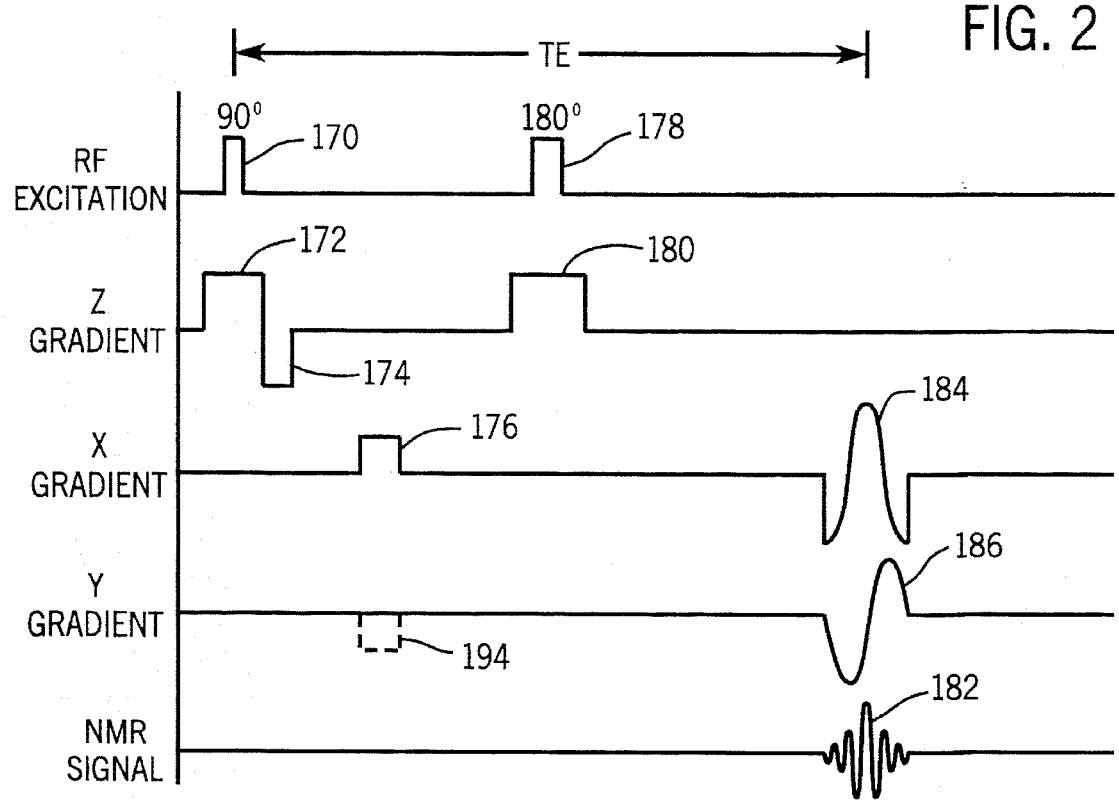
FIG. 2 is a graphic representation of a preferred embodiment of the orbital navigator pulse sequence of the present invention.

Referring particularly to FIG. 2, the preferred embodiment of the orbital navigation pulse sequence is adapted from a spin-echo pulse sequence in which transverse magnetization is produced in a slice by a selective 90° rf excitation pulse 170 applied in the presence of a slice select gradient pulse 172. Spins are rephased in conventional fashion by a negative gradient pulse 174 and are dephased by a gradient pulse 176 directed along one in-plane axis (x axis). A 180° selective rf echo pulse 178 is then applied in the presence of a second slice select gradient pulse 180 and an NMR echo signal 182 is acquired at the echo time (TE).

The orbital navigator pulse sequence is characterized by the application of two sinusoidal readout gradients during the NMR echo signal acquisition. More specifically, during the readout of the NMR echo signal 182 the in-plane magnetic field gradient $G_x$ is modulated in a cosine waveform 184, and the orthogonal in-plane magnetic field gradient $G_y$ is modulated in a sine waveform 186. Both sinusoidal waveforms 184 and 186 complete one cycle during the readout of the NMR echo signal 182.

Figure 3:
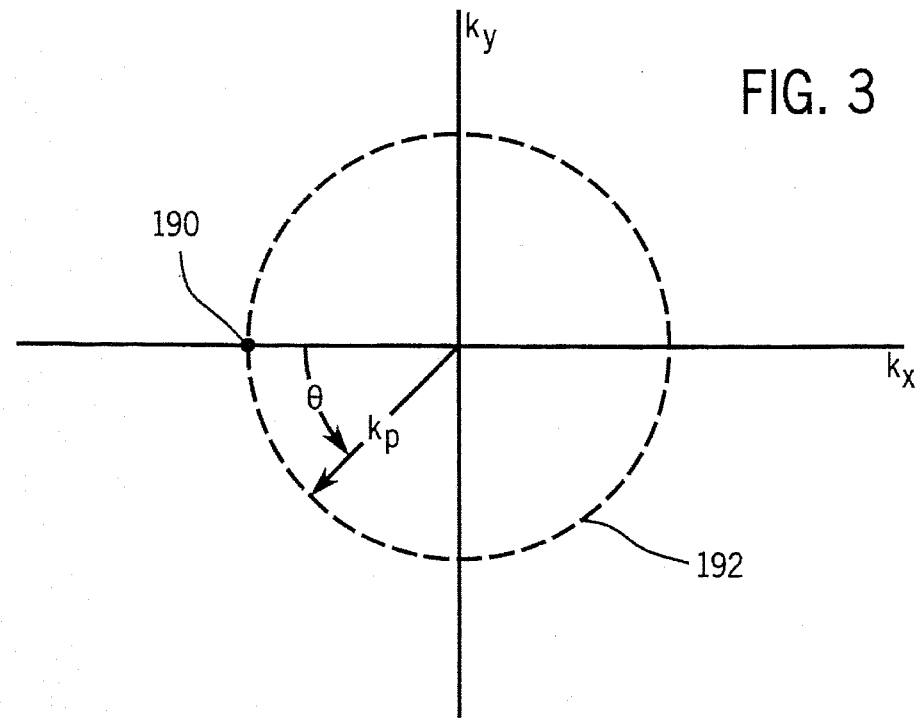
FIG. 3 is a graphic representation of the circular sampling of k-space performed by the pulse sequence of FIG. 2.

Referring particularly to FIG. 3, as a result of the sinusoidal readout gradients 184 and 186, the NMR echo signal 182 samples a circular path in k-space. The $G_x$ dephasing gradient pulse 176 moves the starting sample point 190 in the negative direction along the $k_x$ axis by an amount $k_p$. The sinusoidal gradient pulses 184 and 186 then move the sample point along a circular path 192 having a radius $k_p$, centered about the origin of k-space. Each sample point on the circular path 192 has an angular position ($\theta$) with respect to the starting point 190, and $\theta$ traverses $2\pi$ radians during the sampling of the "orbital navigator" signal 182. Since the sampling ends at the same starting point 190, no residual phase remains at the end of the orbital navigator pulse sequence.

It should be apparent to those skilled in the art that the circular orbit of the sampling in k-space can be accomplished in a number of different ways and the only requirement is that the same method be used for all the orbital NMR navigator signals acquired during the same scan. For example, the starting point 190 on the circular path 192 can be changed to any point on the path 192 merely by changing the dephasing gradient pulse 176 and/or adding a $G_y$ dephasing pulse indicated in FIG. 2 by dashed line 194. The phase of the sinusoidal gradient pulses 184 and 186 must be changed accordingly, and their polarity may be reversed, if desired, to follow the circular orbit in the opposite direction.

The radius $k_p$ is determined by the amplitude of the gradient pulses 184 and 186 and its selection is not arbitrary. With larger $k_p$ values the orbital navigator signal 182 is more sensitive to motion and contains more spatial features that can be used to measure shifts in the modulus values along the sampling axis ($\theta$). On the other hand, larger $k_p$ values produce orbital navigator signals with less signal-to-noise ratio ("SNR") and there is a practical limit at which the corrective shift values can be determined with the desired degree of accuracy. Experiments with phantoms indicate that the best radius ($k_p$) for measuring in-plane rotational motion to within half a degree is from 3/fov to 5/fov, where fov is the field of interest. The best radius ($k_p$) for measuring in-plane translational motion within half a pixel is from 2/fov to 4/fov. In both cases, the accuracy was limited by noise.

Figure 4:
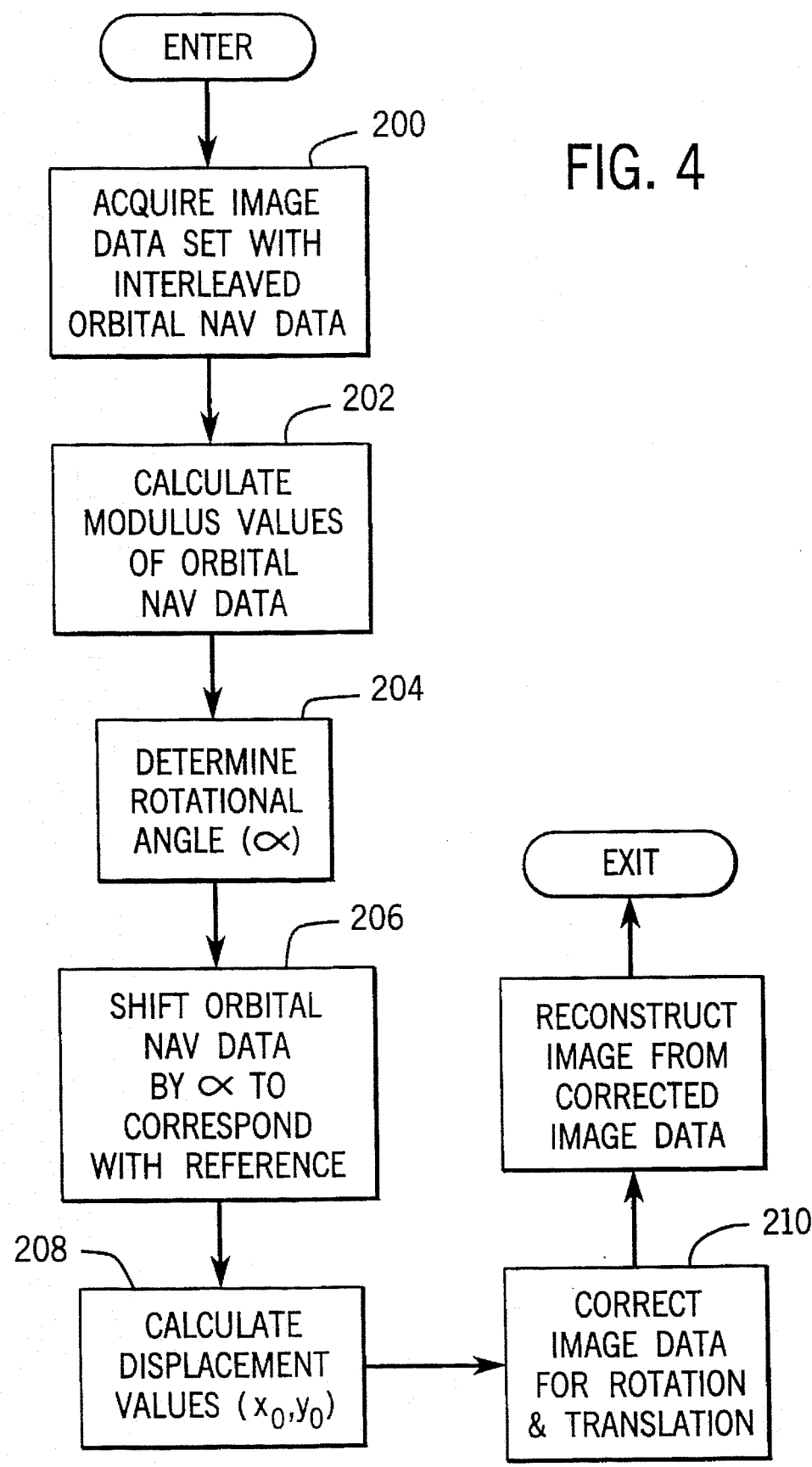
FIG. 4 is a flow chart of a scan performed by the NMR system of FIG. 1 using the preferred embodiment of the invention.

Referring particularly to FIG. 4, a scan according to the preferred embodiment of the invention is carried out under the direction of a program executed by the computer system 107 in FIG. 1. As indicated by process block 200, the desired image data is acquired as a series of views using the imaging pulse sequence of choice. Orbital navigator signals are also acquired, however, by interleaving the navigator pulse sequence of FIG. 2 with the acquired image views. In the most exhaustive use of the invention, the navigator pulse sequence is interleaved between single image pulse sequences, although fewer navigator pulse sequences may also be used where correction accuracy is less demanding. In the preferred embodiment, for example, the scan acquires 256 phase encoded views of image data and 256 corresponding orbital navigator signals. As will now be described, each orbital navigator signal is processed to arrive at phase corrections for its corresponding view of image data.

As indicated by process block 202, prior to any transformation, the I and Q values of each acquired orbital navigator signal are used to calculate its corresponding modulus values:

$$S(\theta) = \sqrt{I(\theta)^2 + Q(\theta)^2}$$

In the preferred embodiment, for example, each orbital navigator signal is comprised of 256 samples and thus a 256 by 256 element array of modulus values results.

As indicated by process block 204, the rotational angle ($\alpha$) of each orbital navigator signal with respect to a reference orbital navigator signal $S_R(\theta)$ (i.e. the first one acquired) is determined. This is accomplished by calculating the shift along the $\theta$ axis of the modulus values $S(\theta)$ of each orbital navigator signal relative to the reference $S_R(\theta)$. This is accomplished by shifting the modulus values $S(\theta)$ along the $\theta$ axis until the best fit is found with the reference $S_R(\theta)$. A least squares fit is performed in the preferred embodiment. As a result, 256 values of the rotational angle ($\alpha$) are produced corresponding to the 256 image data views.

As indicated by process block 206, each untransformed orbital navigator signal is then shifted by its corresponding rotational angle ($\alpha$). This effectively removes the effects of object rotation from the orbital navigator signals so that object displacement values ($X_0$, $Y_0$) can be calculated as indicated at process block 208. Displacement is calculated using the above equation (4), where $\Delta\psi$ is the phase difference at each of the 256 navigator signal samples from the corresponding reference signal sample:

$$\Delta\psi = \tan^{-1} Q/I - \tan^{-1} Q_R/I_R.$$

A pair of displacement values ($x_0$, $y_0$) are thus produced for each of the 256 acquired orbital navigator signals and correspond with the respective 256 image data views.

As indicated at process block 210, the next step in the process is to correct each of the image data views with the corrective values ($\alpha$, $X_0$, $Y_0$) from its corresponding orbital navigator signal. The measured translational movements ($x_0$ and $y_0$) are used to calculate phase corrections for the corresponding NMR image data. This is described in U.S. Pat. No. 4,937,526, entitled "Adaptive Method For Reducing Motion and Flow Artifacts in NMR Images," issued on Jun. 26, 1990, and which is incorporated herein by reference.

The correction for object rotation ($\alpha$) is made by back-rotating the affected NMR image data samples an offsetting amount. The Fourier rotation theorem states that a rotation of the object will produce an equal rotation of its Fourier transform. Thus, rotation correction can be made on the acquired k-space NMR image data.

Although corrective rotation of the affected k-space NMR image data is easy in concept, a number of practical problems arise. For example, when the affected NMR image data is back-rotated, some of the data will be rotated onto k-space data acquired in other views. Similarly, the back-rotation may leave some blank spots in k-space data array. The first problem is overcome by simply ignoring the resulting redundant data and using the unrotated data. Where missing data occurs, satisfactory results have been achieved by zero filling.

A number of difficulties arise from the back-rotation process. One problem created by back-rotating k-space NMR image data is that the sample points do not fall on the expected two-dimensional k-space grid. A bilinear interpolation between surrounding samples is employed to calculate the k-space NMR image data at each missing data point on the rectilinear k-space grid. Another difficulty arises when the object does not rotate around the center of the k-space grid. The statement of the rotation theorem assumes an axis of rotation at the center of the field of view. If this is not the case, the axis of rotation can be shifted to the center by applying the appropriate phase term to the k-space data prior to rotation correction. This phase term can be derived from the Fourier shift theorem. In fact, the offset of the axis of rotation can be determined from the data set itself in certain cases. And, finally, back-rotating k-space data where there is a significant phase roll across the image due to echo miscentering can cause problems because of the abrupt phase transitions induced. This can be compensated by tuning the pulse sequence to center the echo in the data acquisition window, or by retrospectively shifting the echoes.

The 256 corrected image data views may now be used to reconstruct an image as indicated at process block 212. This is a standard 2DFT reconstruction in the preferred embodiment, although other methods may also be used.

While the preferred embodiment of the invention uses the measured in-plane motion to correct the concurrently acquired NMR image data, other uses for the motion measurements are possible. For example, each acquired orbital navigator signal may be processed in real time as the scan is being performed, and the resulting motion measurements used to control the scan. Such control may be a cessation of the scan when the motion exceeds a predetermined amount, or selected views may be reacquired when excessive movement is measured. Also, the motion measurements may be used to gate the further acquisition of image data when the object movement is periodic (e.g., respiratory motion and cardiac motion).

We claim:

1. A method for detecting in-plane movement of a subject during a scan in which an NMR image data set is acquired, the steps comprising:

acquiring the NMR data set using a series of NMR imaging pulse sequences;

interleaving with the series of NMR imaging pulse sequences a series of NMR navigator signal pulse sequences, each navigator signal pulse sequence including the application of two in-plane, orthogonal magnetic field gradients during the readout of its navigator signal such that a resulting navigator signal samples a substantially circular path in k-space;

acquiring the navigator signals during the scan; and analyzing the acquired navigator signals to measure in-plane motion of the subject during the scan.

2. The method as recited in claim 1 in which the measured in-plane motion is translational motion along two different axes during the scan.

3. The method as recited in claim 1 in which the measured in-plane motion is rotational motion of the subject during the scan.

4. The method as recited in claim 1 in which the measured in-plane motion is employed to calculate corrective values and the corrective values are applied to correct the acquired NMR data set.

5. The method as recited in claim 4 in which the corrective values reduce image artifacts caused by in-plane rotational motion of the subject during the scan.

6. The method as recited in claim 4 in which the corrective values reduce image artifacts caused by in-plane translational motion along two different axes during the scan.

7. The method as recited in claim 1 in which the two in-plane, orthogonal magnetic field gradients each have a magnitude that varies sinusoidally during the readout of the navigator signal.

* * * * *